United States Patent [19]

Sweetman

[11] Patent Number: 5,821,790
[45] Date of Patent: Oct. 13, 1998

[54] POWER LINE SYNCHRONIZATION CONDITIONER

[75] Inventor: James David Sweetman, Manitowoc, Wis.

[73] Assignee: Paragon Electric Company, Inc., Two Rivers, Wis.

[21] Appl. No.: 637,292

[22] Filed: Apr. 24, 1996

[51] Int. Cl.⁶ .............................. H03K 12/00
[52] U.S. Cl. ..................... 327/184; 327/62; 327/72
[58] Field of Search .................. 327/184, 164–166, 327/205, 176, 177, 304, 330, 60, 72, 62

[56] References Cited

U.S. PATENT DOCUMENTS

| | | | |
|---|---|---|---|
| 3,743,945 | 7/1973 | Sellari, Jr. | 327/184 |
| 3,944,912 | 3/1976 | Angel et al. | 327/304 |
| 4,015,144 | 3/1977 | Brouckaert | 327/165 |
| 4,524,291 | 6/1985 | Lehning | 327/205 |
| 4,539,617 | 9/1985 | Delaney et al. | 327/330 |
| 4,613,973 | 9/1986 | Dahl | 327/184 |
| 4,797,802 | 1/1989 | Ng et al. | 363/87 |
| 5,003,196 | 3/1991 | Kawaguchi | 327/205 |
| 5,107,135 | 4/1992 | Hagita | 327/184 |
| 5,113,086 | 5/1992 | Cho | 327/184 |
| 5,227,713 | 7/1993 | Bowler et al. | 322/58 |
| 5,319,534 | 6/1994 | Brennen | 363/40 |
| 5,349,517 | 9/1994 | Brennen | 363/40 |
| 5,355,025 | 10/1994 | Moran et al. | 363/39 |
| 5,394,023 | 2/1995 | Gleim et al. | 327/184 |
| 5,465,203 | 11/1995 | Bhattacharya et al. | 363/40 |
| 5,477,171 | 12/1995 | Menegoli et al. | 327/184 |
| 5,498,985 | 3/1996 | Parle et al. | 327/184 |
| 5,554,947 | 9/1996 | Saitou et al. | 327/184 |

FOREIGN PATENT DOCUMENTS

| | | | |
|---|---|---|---|
| 0319104 | 6/1989 | European Pat. Off. | 327/184 |
| 61-152119 | 7/1986 | Japan | 327/184 |
| 62-168420 | 7/1987 | Japan | 327/184 |
| 3-91326 | 4/1991 | Japan | 327/184 |

OTHER PUBLICATIONS

Electronics Sourcebook for Technicians and Engineers, Kaufman, et al. ©1984, 1976 by McGraw–Hill, Inc.; pp. 8–4 to 8–9; 15–8 to 15–9; 16–1 to 16–7.

Primary Examiner—Timothy P. Callahan
Assistant Examiner—Eunja Shin
Attorney, Agent, or Firm—Foley & Lardner

[57] ABSTRACT

A circuit for generating a time base signal from a power line signal produced by an alternating current (AC) power source. The circuit sets the output of a latch to a first state when a positive peak of the power line signal is detected, and sets the output of the latch to a second state when a negative peak is detected. Peaks are detected based upon comparisons between the power line signal and a reference voltage. A reference circuit derives the reference voltage from the power line signal using an AC-to-DC converter to generate a peak voltage signal from the power line signal and a reference generator to generate a reference voltage based upon the peak voltage signal. Positive and negative peaks are detected using positive and negative peak detectors.

18 Claims, 4 Drawing Sheets

POWER LINE SYNCHRONIZATION CONDITIONER

FIELD OF THE INVENTION

The invention generally relates to a circuit for generating a time base signal from a power line signal produced by an alternating current (AC) power source. The invention particularly relates to a line synchronization conditioner including a positive peak detector, a negative peak detector and a latch, wherein the latch is configured to set a time base signal to a first state when a positive peak is detected and to a second state when a negative peak is detected, thereby generating a time base signal with high noise immunity.

BACKGROUND OF THE INVENTION

Various systems perform functions based on the time of day. For example, energy management and control systems typically control the application of electrical power to various electrical devices of different types and with different time-of-day schedules. An energy management and control system may, for example, be configured to apply power to an electric water heater during a first time period, and to switch loads to apply power to a machine tool during a second time period.

Systems that perform functions based on the time of day require an accurate time base. An accurate and inexpensive timing source for a time base is the power line signal produced by an AC power source. Power line signals typically have a frequency of 60 Hz or 50 Hz, although other frequencies are known (e.g., 400 Hz). Electronic circuits can maintain a time base by counting frequency cycles of a power line signal having a known frequency. For example, a time base can be increased by ⅟₆₀ second for each cycle of a 60 Hz power line signal.

However, power line signals often include noise glitches such as spikes or pulses superimposed on the AC signal. Noise glitches may be caused by a variety of sources such as the start-up surge of an electric motor, a change in circuit load, lightning and other sources. Existing circuits for generating a time base signal from a power line signal may mistake noise glitches for valid power line cycles. False cycles cause a fast clock which adversely affects the accuracy of the time base. For example, noise glitches could cause an energy management and control system to switch loads at the wrong time.

To avoid detecting false cycles caused by power line glitches, some existing time base circuits use an RC filter to condition the power line signal. However, RC filters are not successful in filtering out various noise glitches, and false cycles still occur.

Accordingly, it would be desirable to provide a circuit for generating an accurate time base signal from an AC power line signal. It would also be desirable to provide a line synchronization conditioner with high noise immunity for generating a time base signal from an AC power line signal. Also, it would be desirable to provide a circuit for generating a time base signal from a power line signal which is not affected by changes in the amplitude of the power line signal.

SUMMARY OF THE INVENTION

In one embodiment, the invention relates to a circuit for generating a time base signal from a power line signal produced by an AC power source. The circuit includes a positive peak detector coupled to the power source and configured to detect a positive peak when the power line signal exceeds a positive reference value, a negative peak detector coupled to the power source and configured to detect a negative peak when the power line signal is less than a negative reference value, and a latch coupled to the positive peak detector and the negative peak detector. The latch is configured to set the time base signal to a first state when a positive peak is detected and to a second state when a negative peak is detected.

In another embodiment, the invention relates to a line synchronization conditioner for generating a time base signal from an AC power line signal. The conditioner includes a reference circuit configured to generate a voltage reference signal, a transformer including a primary winding associated with the power line signal and a center-tapped secondary winding having a first terminal and a second terminal, a positive peak detector coupled to the first terminal of the secondary winding and configured to detect a positive peak of the power line signal based upon a comparison with the voltage reference signal, and a negative peak detector coupled to the second terminal of the secondary winding and configured to detect a negative peak of the power line signal based upon a comparison with the voltage reference signal. The conditioner also includes a latch coupled to the positive peak detector and the negative peak detector. The latch is configured to set the time base signal to a first state when a positive peak is detected and to a second state when a negative peak is detected.

In still another embodiment, the invention relates to a method of generating a time base signal from a power line signal produced by an AC power source. The method includes the steps of (a) setting the time base signal to a first state when a positive peak of the power line signal is detected, (b) setting the time base signal to a second state when a negative peak of the power line signal is detected, and (c) continuously repeating steps (a) and (b).

BRIEF DESCRIPTION OF THE DRAWINGS

The invention will become more fully understood from the following detailed description of the preferred embodiment thereof, taken in conjunction with the accompanying drawings, wherein like reference numerals refer to like parts, in which.

DETAILED DESCRIPTION OF THE PREFERRED EMBODIMENT

Figure 1:
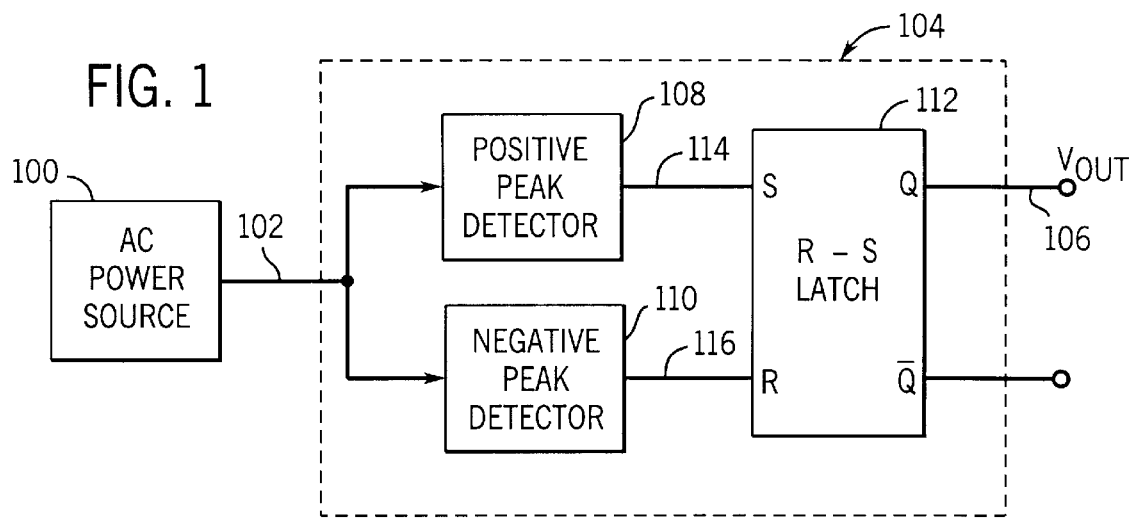
FIG. 1 is an overview block diagram of a circuit for generating a time base signal from an AC power line signal produced by an AC power source.

Referring to FIG. 1, an AC power source 100 generates a power line signal 102 applied to a circuit 104 for generating a time base signal 106 designated $V_{OUT}$. Power line signal 102 is an AC voltage with a typical frequency of 60 or 50 Hz and a typical voltage of 120 or 240 V. The frequency and/or voltage of power line signal 102 may be different provided the frequency is accurate.

Circuit 104 includes a positive peak detector 108, a negative peak detector 110 and a latch 112. Positive peak detector 108 receives power line signal 102 and generates a signal on line 114 when the voltage of power line signal 102 exceeds a positive reference value. Negative peak detector 110 receives power line signal 102 and generates a signal on line 116 when the voltage of power line signal 102 is less than a negative reference value. Latch 112 is typically an R-S latch. Line 114 is connected to the SET input of latch 112 to set time base signal 106 when a positive peak is detected. Line 116 is connected to the RESET input of latch 112 to reset time base signal 106 when a negative peak is detected.

Figure 2:
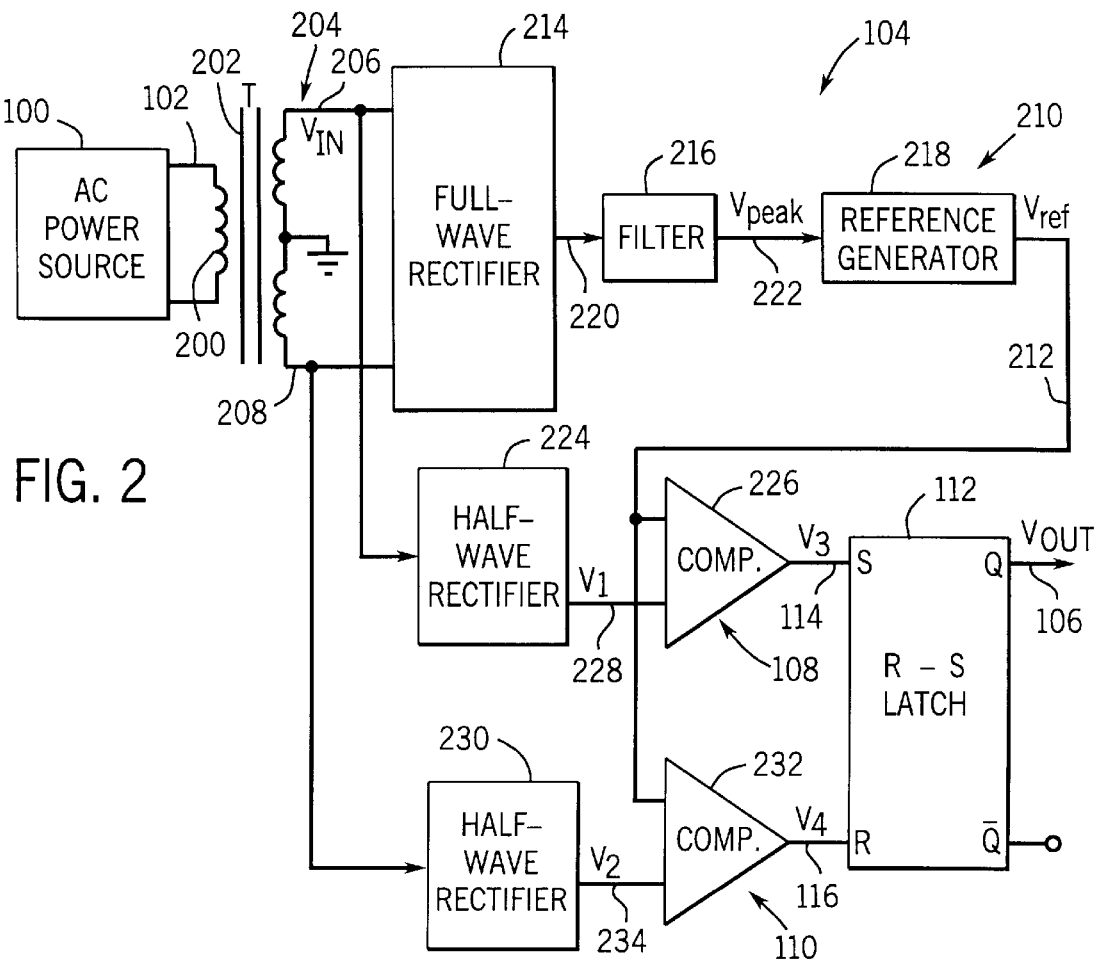
FIG. 2 is a block diagram showing an exemplary circuit for generating a time base signal from an AC power line signal as shown generally in FIG. 1.

Referring to FIG. 2, power line signal 102 produced by AC power source 100 is applied to the primary winding 200 of a transformer 202. Transformer 202 has a center-tapped secondary winding 204 with a first terminal 206 and a second terminal 208. When power line signal 102 is applied across primary winding 200, the polarity of the voltage across secondary winding 204 periodically reverses. On a positive half-cycle of power line signal 102, first terminal 206 is positive and second terminal 208 is negative. On a negative half-cycle of power line signal 102, first terminal 206 is negative and second terminal 208 is positive. The voltage at first terminal 206 is designated as $V_{IN}$ herein.

The voltage across secondary winding 204 is applied to a reference circuit 210 configured to derive a reference voltage $V_{REF}$ from power line signal 102. Reference circuit 210 includes a full-wave rectifier 214, a filter 216 and a reference generator 218. Rectifier 214 receives the voltage across secondary winding 204 and applies a full-wave rectified signal to filter 216 via line 220. Filter 216 smooths the rectified signal and outputs a peak voltage signal $V_{PEAK}$ on line 222. Thus, rectifier 214 and filter 216 form an AC-to-DC converter. Reference generator 218 generates reference voltage $V_{REF}$ on line 212 based upon $V_{PEAK}$. As described below, $V_{REF}$ is typically a predetermined voltage or percentage less than $V_{PEAK}$. In the circuit of FIG. 2, $V_{REF}$ represents both a positive and a negative reference value. However, reference generator 218 could also generate separate positive and negative reference voltages, and/or could generate references with different magnitudes.

Alternatively, reference circuit 210 could generate reference voltage 212 independently of power line signal 102. For example, reference circuit 210 could generate a fixed DC voltage or could borrow a DC voltage already present in the system. However, the accuracy of a peak detection circuit which performs a comparison between a fixed DC reference voltage and power line signal 102 may be adversely affected by changes in the amplitude of power line signal 102.

Positive peak detector 108 receives the voltage from the first terminal 206 of secondary winding 204 and generates a signal $V_3$ on line 114 when a positive peak of power line signal 102 is detected. Detector 108 includes a half-wave rectifier 224 and a comparator 226. Rectifier 224 generates a positive half-cycle voltage $V_1$ on line 228 in response to a positive half-cycle of power line signal 102. When the positive half-cycle voltage $V_1$ exceeds the reference voltage $V_{REF}$ on line 212, comparator 226 detects a positive peak of power line signal 102 and generates a signal $V_3$ on line 114.

Similarly, negative peak detector 110 receives the voltage from the second terminal 208 of secondary winding 204 and generates a signal $V_4$ on line 116 when a negative peak of power line signal 102 is detected. Detector 110 includes a half-wave rectifier 230 and a comparator 232. Rectifier 230 generates a negative half-cycle voltage $V_2$ on line 234 in response to a negative half-cycle of power line signal 102. $V_2$ is a positive voltage that represents the negative half-cycle of power line signal 102. When the negative half-cycle voltage $V_2$ exceeds the reference voltage $V_{REF}$ on line 212, comparator 232 detects a negative peak of power line signal 102 and generates a signal $V_4$ on line 116.

Lines 114 and 116 are connected to latch 112 as explained above in relation to FIG. 1. The operation of FIG. 2 is explained below in relation to FIG. 4.

Figure 3:
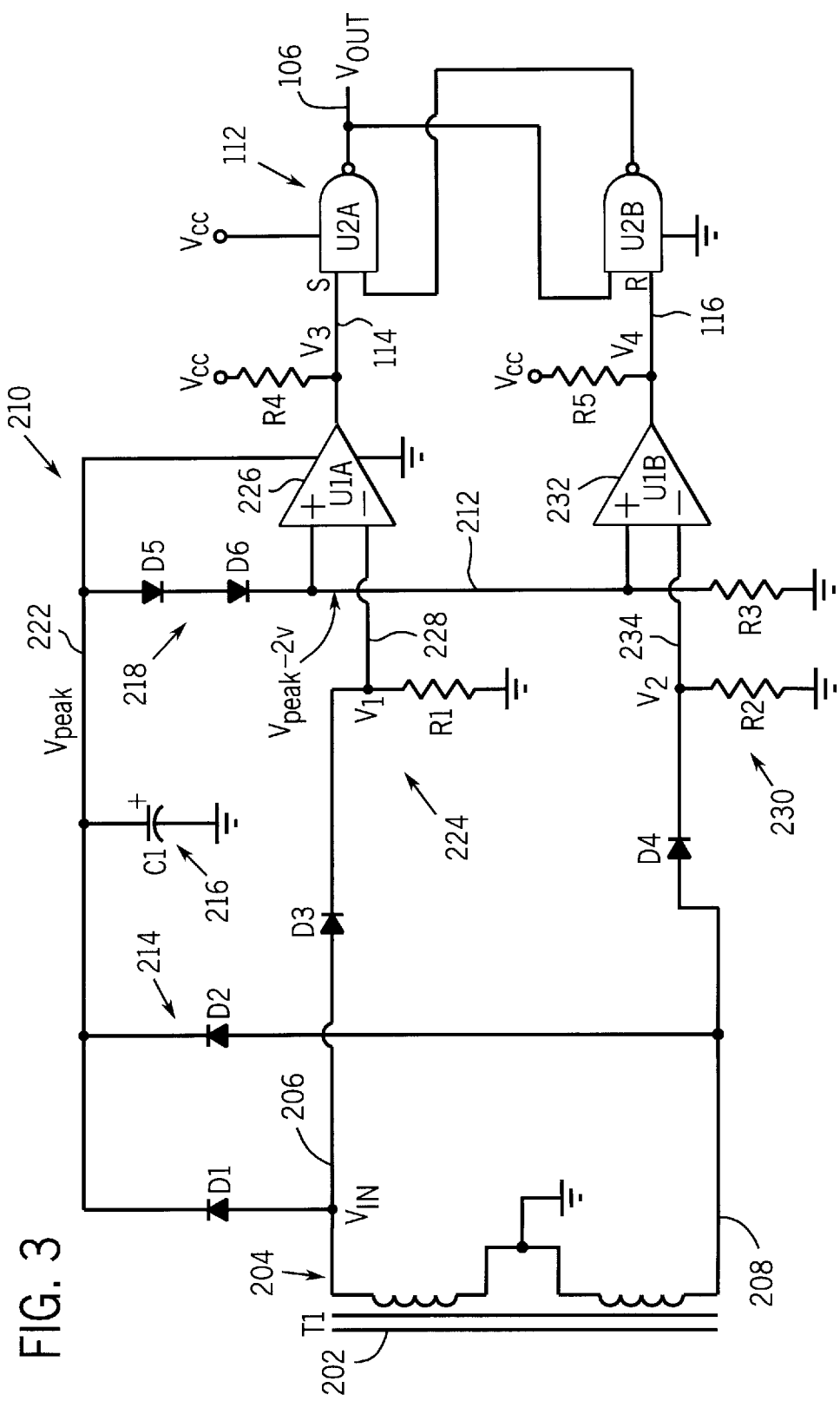
FIG. 3 is an electrical schematic diagram showing an exemplary embodiment of the circuit shown in FIG. 2.

Referring to FIG. 3, an exemplary electrical schematic diagram of an embodiment of the circuit of FIG. 2 is shown. D1–D4 are 1N4007 rectifier diodes, D5 is a 1N4148 switching diode, D6 is an LED, R1, R2, R4 and R5 are 10 Kohm resistors, R3 is a 1.5 Kohm resistor, C1 is a 1000 uF capacitor, U1 is an LM339 comparator, U2 is a 74HC132 NAND, and T1 is a 120/240 to 20 VCT transformer. Like reference numerals on FIG. 3 correspond to like reference numerals on FIGS. 1 and 2. These components are connected as shown in FIG. 3.

Figure 4:
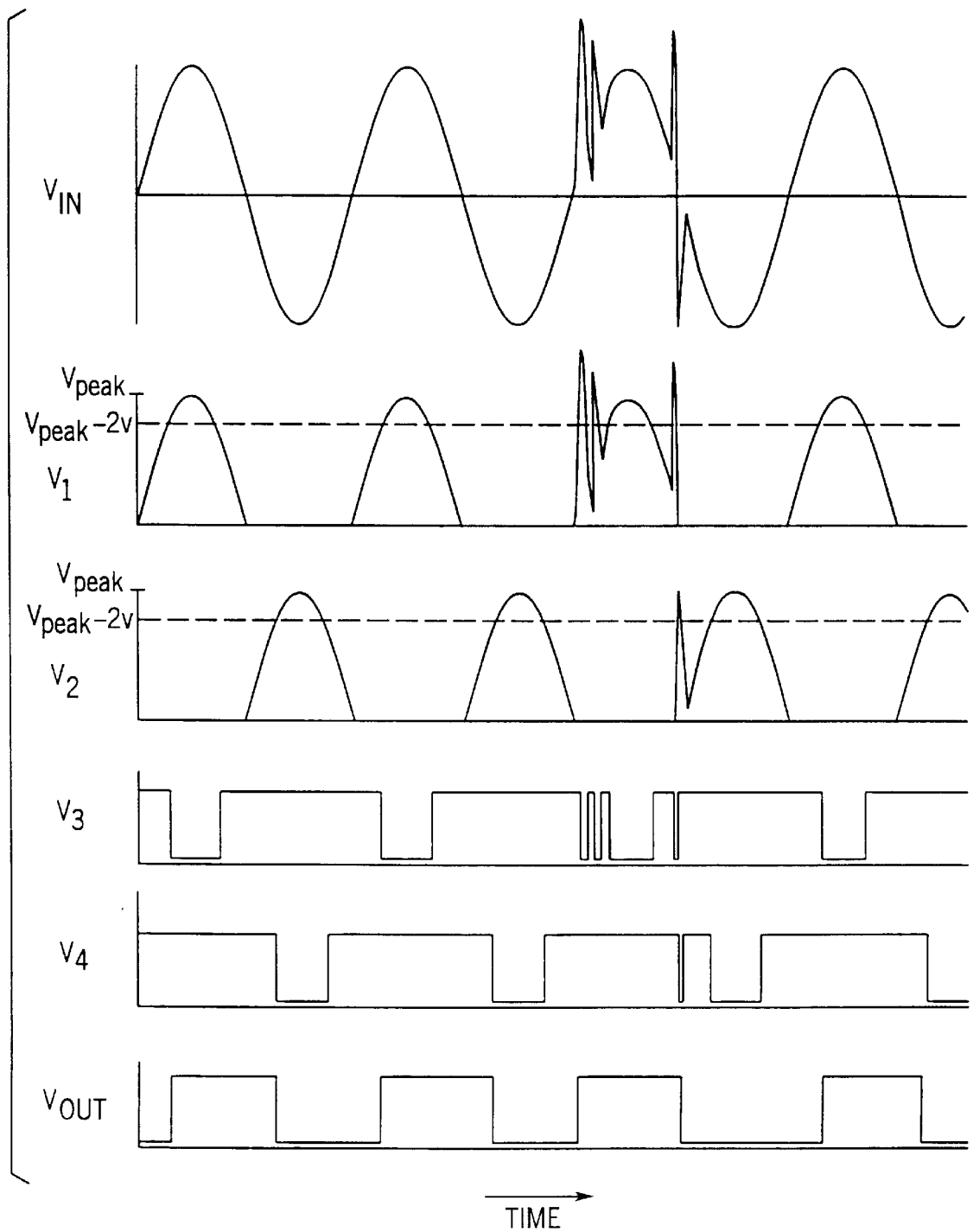
FIG. 4 is a timing diagram showing the voltage waveforms at several nodes in the circuits of FIGS. 2 and 3.

The operation of the circuits shown in FIGS. 2 and 3 is explained in relation to the timing diagram of FIG. 4. Power line signal 102 induces voltage $V_{IN}$ at the first terminal 206 of secondary winding 204. $V_{IN}$ is an AC voltage which may experience positive and negative noise glitches. D1, D2 and C1 form a full-wave rectifier and filter circuit 214, 216 which generates the peak voltage signal $V_{PEAK}$. D5, D6 and R3 form reference generator 218 which generates the reference voltage $V_{REF}$. $V_{REF}$ has a voltage equal to $V_{PEAK}$ less the voltage drop across D5 and D6, and may be approximately equal to $V_{PEAK}-2$ V. Because $V_{REF}$ is derived from $V_{PEAK}$, the circuit is not affected by changes in the amplitude of power line signal 102. Alternatively, a voltage-divider circuit using resistors could be used to generate a reference voltage $V_{REF}$ equal to a predetermined percentage of $V_{PEAK}$.

D3 and R1 form half-wave rectifier 224 which generates positive half-cycle voltage $V_1$, and D4 and R2 form half-wave rectifier 230 which generates negative half-cycle voltage $V_2$. As shown in the $V_1$ and $V_2$ timing diagrams of FIG. 4, both the AC signal and superimposed noise glitches on $V_{IN}$ are rectified.

U1A and U1B form comparators 226 and 232, respectively. The open-collector outputs $V_3$ and $V_4$ of the comparators are normally pulled high by pull-up resistors R4 and R5, respectively. However, as shown in FIG. 4, comparator 226 generates an active-low signal $V_3$ when the positive half-cycle voltage $V_1$ exceeds reference voltage $V_{REF}$ (equal to $V_{PEAK}-2$ V), and comparator 232 generates an active-low signal $V_4$ when the negative half-cycle voltage $V_2$ exceeds reference voltage $V_{REF}$ (equal to $V_{PEAK}-2$ V). Thus, active-low signals on $V_3$ and $V_4$ correspond to positive and negative peaks, respectively, of power line signal 102. $V_3$ and $V_4$ respond to peaks caused by the AC signal and by superimposed noise glitches.

When power line signal 102 is not at a peak, $V_3$ and $V_4$ are high and time base signal 106 is latched in its previous state as shown by the $V_{OUT}$ waveform of FIG. 4. When a positive peak is detected, $V_3$ goes low and R-S latch 112 is SET, thereby causing $V_{OUT}$ to go high. When a negative peak is detected, $V_4$ goes low and R-S latch 112 is RESET, thereby causing $V_{OUT}$ to go low. If a noise glitch occurs before a real peak is detected, $V_{OUT}$ may switch states early.

When the real peak is detected, the R-S latch is already in the appropriate state and the extra count is ignored. If a noise glitch occurs after a real peak is detected, the R-S latch will ignore the false peak since it was already switched by the real peak. Although noise on power line signal 102 may cause the duty cycle of $V_{OUT}$ to change, the frequency will not be affected. Thus, noise glitches do not generate false line cycle counts and the time base is accurate.

Figure 5:
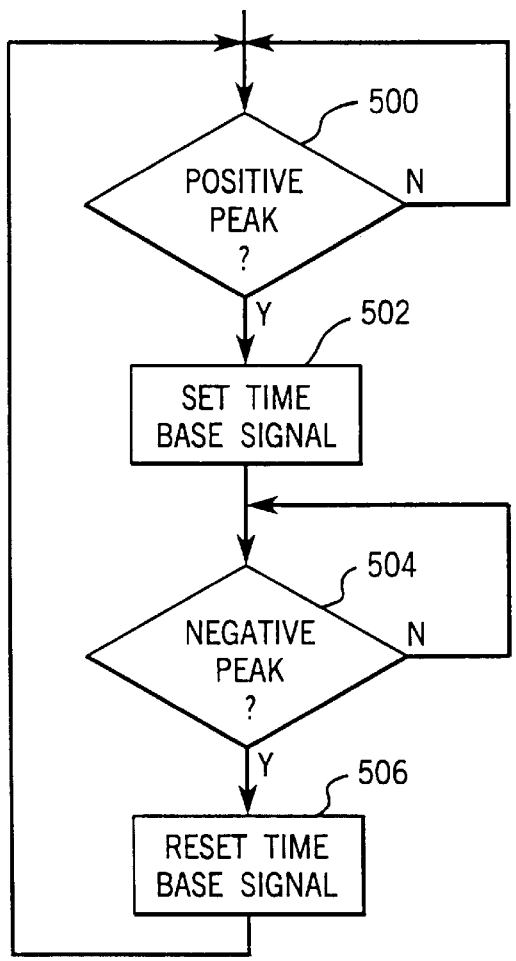
FIG. 5 is a flowchart diagram showing a method of generating a time base signal from a power line signal produced by an AC power source.
Figure 6:
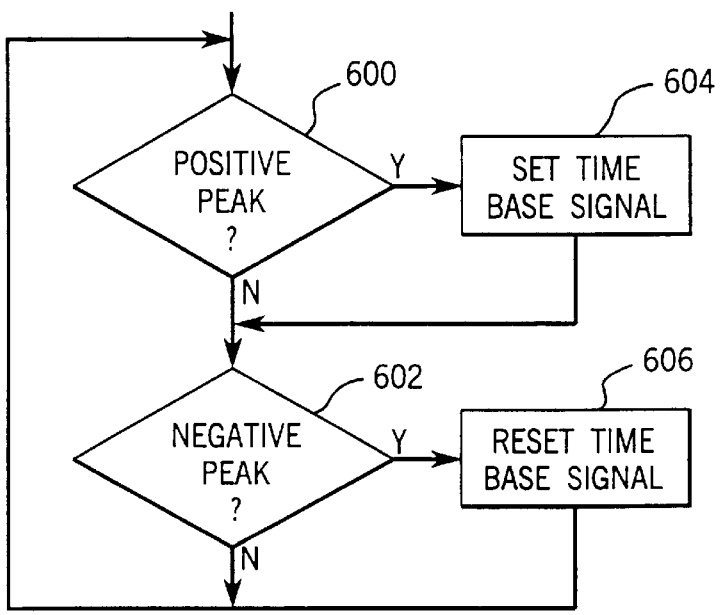
FIG. 6 is a flowchart diagram showing another embodiment of the method shown in FIG. 5.

Referring to FIGS. 5 and 6, a method is shown in flowchart form for generating a time base signal from a power line signal produced by an AC power source. At step 500 in FIG. 5, the logic waits for a positive peak of the power line signal and then sets a time base signal at step 502 when a positive peak is detected. At step 504, the logic waits for a negative peak and then resets the time base signal at step 506 when a negative peak is detected. The logic then repeats at step 500.

An alternative flowchart for this method is shown in FIG. 6. The logic continuously checks for a positive peak at step 600 and a negative peak at step 602. If a positive peak is detected, the logic sets a time base signal at step 604. If a negative peak is detected, the logic resets the time base signal at step 606.

While the embodiments illustrated in the FIGURES and described above are presently preferred, it should be understood that these embodiments are offered by way of example only. The invention is not intended to be limited to any particular embodiment, but is intended to extend to various modifications that nevertheless fall within the scope of the appended claims.

What is claimed is:

1. A circuit for generating a time base signal from a power line signal produced by an AC power source comprising:
    a reference circuit configured to derive a single direct current (DC) reference signal from the power line signal and apply the DC reference signal to a reference output;
    a positive peak detector coupled to the power source and the reference output, and configured to detect a positive peak when the power line signal is positive and has a magnitude which exceeds the single DC reference signal;
    a negative peak detector coupled to the power source and the reference output, and configured to detect a negative peak when the power line signal is negative and has a magnitude which exceeds the single DC reference signal;
    a latch coupled to the positive peak detector and the negative peak detector, wherein the latch is configured to set the time base signal to a first state when a positive peak is detected and to a second state when a negative peak is detected.

2. The circuit of claim 1 wherein the reference circuit comprises:
    an AC-to-DC converter coupled to the power source and configured to derive a peak voltage signal from the power line signal; and
    a reference generator coupled to the AC-to-DC converter and configured to generate the single DC reference signal based upon the peak voltage signal.

3. The circuit of claim 2 wherein the AC-to-DC converter comprises a full-wave rectifier and a filter.

4. The circuit of claim 1 wherein the positive peak detector comprises:
    a first half-wave rectifier coupled to the power source and configured to generate a positive half-cycle voltage from the power line signal; and
    a first comparator configured to detect a positive peak of the power line signal based upon a comparison between the single DC reference signal and the positive half-cycle voltage.

5. The circuit of claim 4 wherein the negative peak detector comprises:
    a second half-wave rectifier coupled to the power source and configured to generate a negative half-cycle voltage from the power line signal; and
    a second comparator configured to detect a negative peak of the power line signal based upon a comparison between the single DC reference signal and the negative half-cycle voltage.

6. The circuit of claim 1 wherein the latch is an R-S latch having a set input coupled to the positive peak detector and a reset input coupled to the negative peak detector, whereby the latch is set when a positive peak is detected and reset when a negative peak is detected.

7. A line synchronization conditioner for generating a time base signal from an AC power line signal comprising:
    a reference circuit configured to generate a DC voltage reference signal;
    a transformer including a primary winding associated with the power line signal and a center-tapped secondary winding having a first terminal and a second terminal;
    a positive peak detector coupled to the first terminal of the secondary winding and configured to detect a positive peak of the power line signal based upon a comparison with the DC voltage reference signal;
    a negative peak detector coupled to the second terminal of the secondary winding and configured to detect a negative peak of the power line signal based upon a comparison with the DC voltage reference signal; and
    a latch coupled to the positive peak detector and the negative peak detector, wherein the latch is configured to set the time base signal to a first state when a positive peak is detected and to a second state when a negative peak is detected.

8. The conditioner of claim 7 wherein the reference circuit derives the DC voltage reference signal from the power line signal.

9. The conditioner of claim 7 wherein the reference circuit comprises:
    a full-wave rectifier and filter circuit coupled to the secondary winding of the transformer and configured to generate a peak voltage signal; and
    a reference generator coupled to the rectifier and filter circuit and configured to generate the DC voltage reference signal based upon the peak voltage signal.

10. The conditioner of claim 9 wherein the rectifier and filter circuit comprises a first diode coupled to the first terminal of the secondary winding, a second diode coupled to the second terminal of the secondary winding, and a capacitor coupled to the first diode and the second diode, wherein the capacitor is charged with current flowing through the first diode during a positive half-cycle of the power line signal and with current flowing through the second diode during a negative half-cycle of the power line signal.

11. The conditioner of claim 9 wherein the reference generator comprises at least one diode electrically coupled between the peak voltage signal and the DC voltage reference signal, wherein the DC voltage reference signal is substantially equal to the peak voltage signal less the voltage drop across the at least one diode.

12. The conditioner of claim 7 wherein the positive peak detector comprises:
  a first half-wave rectifier coupled to the first terminal of the secondary winding and configured to generate a positive half-cycle voltage; and
  a first comparator configured to detect a positive peak of the power line signal based upon a comparison between the DC voltage reference signal and the positive half-cycle voltage.

13. The conditioner of claim 12 wherein the negative peak detector comprises:
  a second half-wave rectifier coupled to the second terminal of the secondary winding and configured to generate a negative half-cycle voltage; and
  a second comparator configured to detect a negative peak of the power line signal based upon a comparison between the DC voltage reference signal and the negative half-cycle voltage.

14. The conditioner of claim 13 wherein the first and the second half-wave rectifiers each comprises a diode connected in series with a resistor.

15. The conditioner of claim 7 wherein the latch is an R-S latch having a set input coupled to the positive peak detector and a reset input coupled to the negative peak detector, whereby the latch is set when a positive peak is detected and reset when a negative peak is detected.

16. A method of generating a time base signal from a power line signal produced by an AC power source comprising the steps of:
  (a) generating a single DC reference voltage from the power line signal;
  (b) setting the time base signal to a first state when the power line signal is positive and has a magnitude which exceeds the single DC reference voltage;
  (c) setting the time base signal to a second state when the power line signal is negative and has a magnitude which exceeds the single DC reference voltage; and
  (d) continuously repeating steps (a), (b) and (c).

17. The method of claim 16 wherein, in step (d), step (c) is performed only after a positive peak is detected by step (b), and step (b) is performed only after a negative peak is detected by step (c).

18. The method of claim 16 wherein, in step (d), step (c) is performed after step (b) and step (b) is performed after step (c) regardless of the value of the power line signal.

* * * * *